(12) United States Patent
Zimmer et al.

(10) Patent No.: US 7,934,209 B2
(45) Date of Patent: Apr. 26, 2011

(54) METHOD FOR FIRMWARE VARIABLE STORAGE WITH EAGER COMPRESSION, FAIL-SAFE EXTRACTION AND RESTART TIME COMPRESSION SCAN

(75) Inventors: Vincent Zimmer, Federal Way, WA (US); Michael Rothman, Puyallup, WA (US); Greg Miller, Portland, OR (US); Mark Doran, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 1244 days.

(21) Appl. No.: 10/561,049

(22) PCT Filed: May 26, 2004

(86) PCT No.: PCT/US2004/016585
§ 371 (c)(1),
(2), (4) Date: Sep. 28, 2006

(87) PCT Pub. No.: WO2005/002060
PCT Pub. Date: Jan. 6, 2005

(65) Prior Publication Data
US 2007/0033322 A1    Feb. 8, 2007

(51) Int. Cl.
*G06F 9/44* (2006.01)
(52) U.S. Cl. ......... 717/168; 717/124; 717/126; 711/103
(58) Field of Classification Search ........... 717/168–173
See application file for complete search history.

(56) References Cited

U.S. PATENT DOCUMENTS 5,621,885 A * 4/1997 Del Vigna, Jr. ................. 714/13
5,706,460 A * 1/1998 Craig et al. ................... 712/204
5,752,066 A * 5/1998 Bealkowski et al. ............. 712/1
5,761,536 A * 6/1998 Franaszek ....................... 710/68
5,867,712 A * 2/1999 Shaw et al. .................... 717/127

(Continued)

FOREIGN PATENT DOCUMENTS

CN       1186277         7/1998

(Continued)

OTHER PUBLICATIONS

Title: Post-processing enhancement of decompressed images using variable order Bezier polynomials and distance transform, author: Mayer J et al, dated: Mar. 30, 1998, source: IEEE.*

(Continued)

*Primary Examiner* — Chameli C Das
(74) *Attorney, Agent, or Firm* — Blakely, Sokoloff, Taylor & Zafman LLP

(57) ABSTRACT

Firmware-based conversion methods for storing converted firmware variables in a firmware storage device, such as flash memory. Under one method, "eager" compression of firmware is performed. In response to a storage request, a determination is made to whether a compressor is available. If it is, the firmware variable is stored in a compressed form in the storage device; if not, the firmware variable is stored in an uncompressed form. In response to a read request for a stored firmware variable, a determination is made to whether the variable is stored in a compressed or uncompressed form. If it is compressed, a decompressor is employed to return the variable to its uncompressed form prior to providing it to the requestor; already uncompressed variables are provided directly to the requester. An application program interface is provided to enable operating system runtime access to the firmware variables. Similar conversions may be employed separately or in parallel, including encryption.

13 Claims, 11 Drawing Sheets

U.S. PATENT DOCUMENTS

| | | | |
|---|---|---|---|
| 5,901,310 A * | 5/1999 | Rahman et al. | 713/1 |
| 5,999,989 A | 12/1999 | Patel | |
| 6,038,685 A * | 3/2000 | Bissett et al. | 714/12 |
| 6,622,302 B1 * | 9/2003 | Delaney et al. | 717/170 |
| 6,681,310 B1 * | 1/2004 | Kusters et al. | 711/202 |
| 6,832,373 B2 * | 12/2004 | O'Neill | 717/171 |
| 6,959,337 B2 * | 10/2005 | McLaughlin et al. | 709/229 |
| 7,028,215 B2 * | 4/2006 | Depew et al. | 714/7 |
| 7,206,953 B1 * | 4/2007 | Wilson | 713/324 |
| 7,222,258 B2 * | 5/2007 | Rothman et al. | 714/6 |
| 7,222,339 B2 * | 5/2007 | Rothman et al. | 717/168 |
| 7,392,518 B1 * | 6/2008 | Chhabra et al. | 717/168 |
| 7,558,804 B1 * | 7/2009 | Polydov | 1/1 |
| 7,562,208 B1 * | 7/2009 | Reed et al. | 713/1 |
| 7,590,838 B2 * | 9/2009 | Oguma | 713/2 |
| 7,669,195 B1 * | 2/2010 | Qumei | 717/170 |
| 7,747,994 B1 * | 6/2010 | Yang | 717/168 |
| 7,805,245 B2 * | 9/2010 | Bacon et al. | 701/220 |
| 2002/0165929 A1 * | 11/2002 | McLaughlin et al. | 709/213 |
| 2003/0066062 A1 * | 4/2003 | Brannock et al. | 717/169 |
| 2003/0208650 A1 * | 11/2003 | Depew et al. | 710/302 |
| 2003/0223646 A1 * | 12/2003 | O'Neill | 382/246 |
| 2004/0001207 A1 * | 1/2004 | Nishimura | 358/1.2 |
| 2004/0015952 A1 * | 1/2004 | Lajoie et al. | 717/171 |
| 2004/0091042 A1 * | 5/2004 | Herath | 375/240 |
| 2004/0255286 A1 * | 12/2004 | Rothman et al. | 717/168 |
| 2005/0114852 A1 * | 5/2005 | Chen et al. | 717/168 |
| 2005/0120081 A1 * | 6/2005 | Ikenn | 709/203 |
| 2005/0144612 A1 * | 6/2005 | Wang et al. | 717/168 |
| 2005/0273584 A1 * | 12/2005 | Wisecup et al. | 713/1 |
| 2006/0026548 A1 * | 2/2006 | Roesner et al. | 716/18 |
| 2007/0052842 A1 * | 3/2007 | Luna et al. | 348/395.1 |

FOREIGN PATENT DOCUMENTS

| | | |
|---|---|---|
| GB | 2276257 | 9/1994 |
| JP | 2002358207 | 12/2002 |
| WO | 0058838 | 10/2000 |

OTHER PUBLICATIONS

Title: Energy savings through compression in embedded Java environments, author: G Chen et al, dated: May 6, 2002, source: IEEE.*

PCT Notification Concerning Transmittal of International Preliminary Report on Patentability (Chapter 1 of the Patent Cooperation Treaty) (PCT Rule 44bis.1(c)) for PCT Counterpart Application No. PCT/US2004/016585, 8 pgs. (Jan. 5, 2006).

EPO, "Office Action", European Application No. 04 753 416.9-1243, dated Apr. 9, 2009, 6 pages.

"International Search Report", International Application No. PCT/US2004/016585, mailed Oct. 6, 2005, (Sep. 16, 2005), whole document.

"Written Opinion", International Application No. PCT/US2004/016585, Mailed Dec. 19, 2005, whole document.

CN PTO, "Secone Office Action", Chinese Application No. 200480016970.5, Mailed Sep. 22, 2009, whole document.

David, J., "Security in a Flash", Computers & Security, Elsevier Science Publishers, Amsterdam, NL, vol. 22, No. 1, Jan. 1, 2003, XP004410375, pp. 29-33.

Bealkowski, R. et al., "Firmware Image Compression", *IBM Technical Disclosure Bulletin*, IBM Corp. New York, vol. 38, No. 4, Apr. 1, 1995, XP000516080, (0018-8689), pages.

* cited by examiner

METHOD FOR FIRMWARE VARIABLE STORAGE WITH EAGER COMPRESSION, FAIL-SAFE EXTRACTION AND RESTART TIME COMPRESSION SCAN

CROSS-REFERENCE TO RELATED APPLICATIONS

This application is a National Phase application of International Application No. PCT/US2004/016585, filed May 26, 2004, entitled METHOD FOR FIRMWARE VARIABLE STORAGE WITH EAGER COMPRESSION, FAIL-SAFE EXTRACTION AND RESTART TIME COMPRESSION SCAN. The present application claims priority to International Application No. PCT/US2004/016585, filed May 26, 2004.

FIELD OF THE INVENTION

The field of invention relates generally to computer systems and, more specifically but not exclusively relates to a scheme for storing variable data in firmware in a compressed form.

BACKGROUND INFORMATION

Computer platform firmware is used during initialization of computer systems to verify system integrity and configuration. It also generally provides the basic low-level interface between hardware and software components of those computer systems, enabling specific hardware functions to be implemented via execution of higher-level software instructions contained in computer programs that run on the computer systems. In many computers, a primary portion of this firmware is known as the Basic Input/Output System (BIOS) code of a computer system. The BIOS code comprises a set of permanently recorded (or semi-permanently recorded in the case of systems that use flash BIOS) software routines that provides the system with its fundamental operational characteristics, including instructions telling the computer how to test itself when it is turned on, and how to determine the configurations for various built-in components and add-in peripherals.

In a typical PC architecture, the BIOS is generally defined as the firmware that runs between the processor reset and the first instruction of the Operating System (OS) loader. This corresponds to the startup operations performed during a cold boot or in response to a system reset. At the start of a cold boot, very little of the system beyond the processor and firmware is actually initialized. It is up to the code in the firmware to initialize the system to the point that an operating system loaded off of media, such as a hard disk, can take over.

Typically, firmware code is stored in a "monolithic" form comprising a single set of code that is provided by a platform manufacturer or a BIOS vendor such as Phoenix or AMI. Various portions of the single set of code are used to initialize different system components, while other portions are used for run-time (i.e., post-boot) operations. In other situations, a monolithic BIOS may be extended using one or more "Option ROMs" that are contained on one or more periphery device cards (a.k.a., "add-in" cards). For example, SCSI device driver cards and video cards often include an option ROM that contains BIOS code corresponding to services provided by these cards. Typically, firmware in option ROMs is loaded after the firmware in the monolithic BIOS has been loaded or during loading of the monolithic BIOS in accordance with a predefined scheme.

Today's firmware architectures include provisions for extending BIOS functionality beyond that provided by the BIOS code stored in a platform's BIOS device (e.g., flash memory). More particularly, the Extensible Firmware Interface (EFI) (specifications and examples of which may be found at http://developer.intel.com/technology/efi) is a public industry specification that describes an abstract programmatic interface between platform firmware and shrink-wrap operation systems or other custom application environments. The EFI framework include provisions for extending BIOS functionality beyond that provided by the BIOS code stored in a platform's BIOS device (e.g., flash memory). EFI enables firmware, in the form of firmware modules and drivers, to be loaded from a variety of different resources, including primary and secondary flash devices, option ROMs, various persistent storage devices (e.g., hard disks, CD ROMs, etc.), and even over computer networks.

Among many features, EFI provides an abstraction for storing persistent values in the platform firmware known as "variables." Variables are defined as key/value pairs that consist of identifying information plus attributes (the key) and arbitrary data (the value). Variables are intended for use as a means to store data that is passed between the EFI environment implemented in the platform and EFI OS loaders and other applications that run in the EFI environment. Although the implementation of variable storage is not defined in the EFI specification, variables must be persistent in most cases. This implies that the EFI implementation on a platform must arrange it so that variables passed in for storage are retained and available for use each time the system boots, at least until they are explicitly deleted or overwritten. Provision of this type of nonvolatile storage may be very limited on some platforms, often requiring variables to be used sparingly in cases where other means of communicating information cannot be used.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of methods, firmware, and computer systems corresponding to a scheme for storing firmware variables with compression and fail-safe extraction are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with aspects of the invention, a framework is disclosed that provides a mechanism to enable compression and fail-safe extraction of firmware variables. Embodiments of the invention provide means by which to virtualize the flash storage of a platform via decompression/compression in a way that can seamlessly degrade (i.e., fail-safely) if the compressor is lost.

Figure 1:
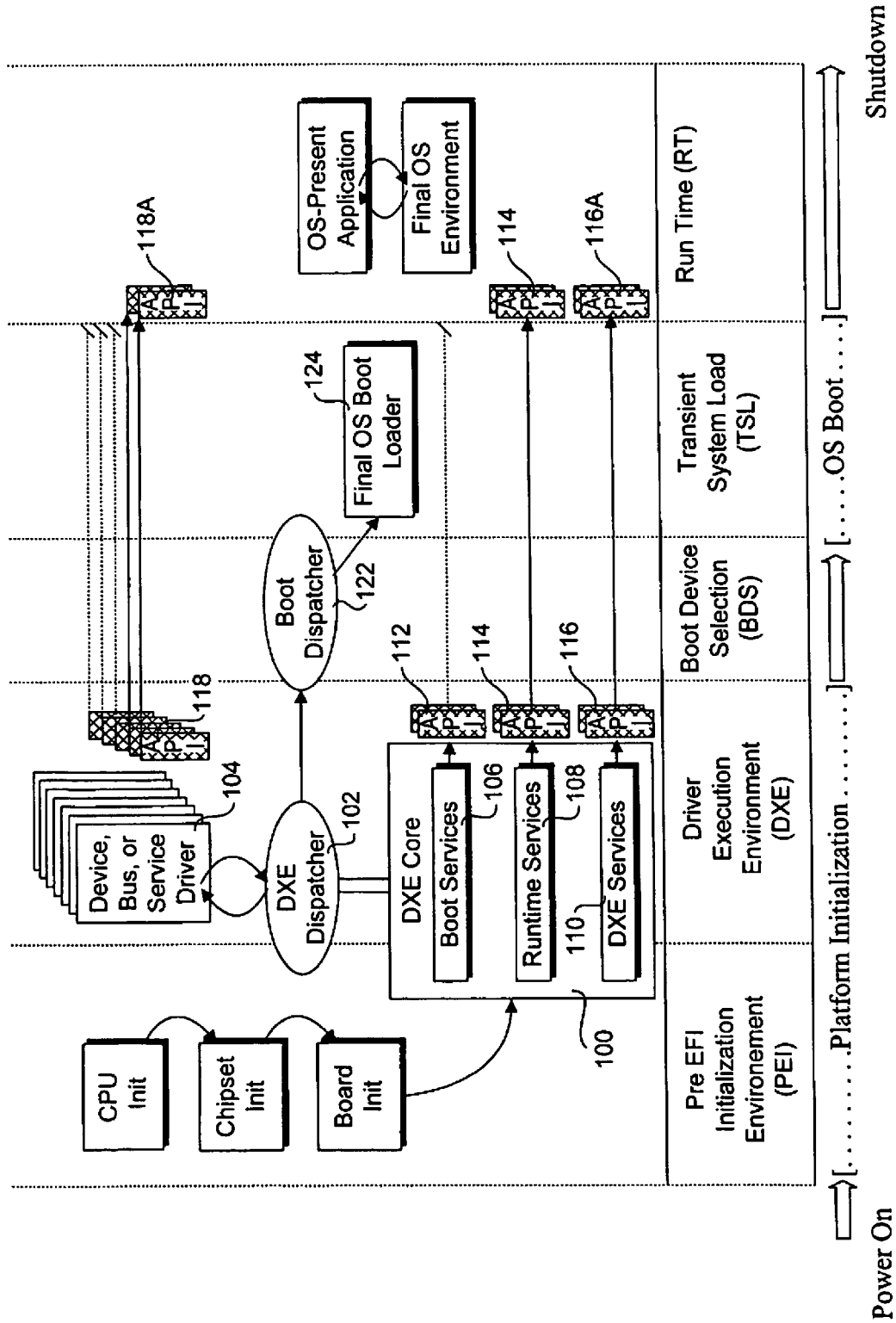
FIG. 1 is a schematic diagram illustrating the various execution phases that are performed in accordance with the extensible firmware interface (EFI) framework.

In accordance with one embodiment, the framework is implemented via facilities provided by EFI. FIG. 1 shows an event sequence/architecture diagram used to illustrate operations performed by a platform under an EFI-compliant framework in response to a cold boot (e.g., a power off/on reset). The process is logically divided into several phases, including a pre-EFI Initialization Environment (PEI) phase, a Driver Execution Environment (DXE) phase, a Boot Device Selection (BDS) phase, a Transient System Load (TSL) phase, and an operating system runtime (RT) phase. The phases build upon one another to provide an appropriate run-time environment for the OS and platform.

The PEI phase provides a standardized method of loading and invoking specific initial configuration routines for the processor (CPU), chipset, and motherboard. The PEI phase is responsible for initializing enough of the system to provide a stable base for the follow on phases. Initialization of the platforms core components, including the CPU, chipset and main board (i.e., motherboard) is performed during the PEI phase. This phase is also referred to as the "early initialization" phase. Typical operations performed during this phase include the POST (power-on self test) operations, and discovery of platform resources. In particular, the PEI phase discovers memory and prepares a resource map that is handed off to the DXE phase. The state of the system at the end of the PEI phase is passed to the DXE phase through a list of position independent data structures called Hand Off Blocks (HOBs).

The DXE phase is the phase during which most of the system initialization is performed. The DXE phase is facilitated by several components, including the DXE core 100, the DXE dispatcher 102, and a set of DXE drivers 104. The DXE core 100 produces a set of Boot Services 106, Runtime Services 108, and DXE Services 110. The DXE dispatcher 102 is responsible for discovering and executing DXE drivers 104 in the correct order. The DXE drivers 104 are responsible for initializing the processor, chipset, and platform components as well as providing software abstractions for console and boot devices. These components work together to initialize the platform and provide the services required to boot an operating system. The DXE and the Boot Device Selection phases work together to establish consoles and attempt the booting of operating systems. The DXE phase is terminated when an operating system successfully begins its boot process (i.e., the BDS phase starts). Only the runtime services and selected DXE services provided by the DXE core and selected services provided by runtime DXE drivers are allowed to persist into the OS runtime environment. The result of DXE is the presentation of a fully formed EFI interface.

The DXE core is designed to be completely portable with no CPU, chipset, or platform dependencies. This is accomplished by designing in several features. First, the DXE core only depends upon the HOB list for its initial state. This means that the DXE core does not depend on any services from a previous phase, so all the prior phases can be unloaded once the HOB list is passed to the DXE core. Second, the DXE core does not contain any hard coded addresses. This means that the DXE core can be loaded anywhere in physical memory, and it can function correctly no matter where physical memory or where Firmware segments are located in the processor's physical address space. Third, the DXE core does not contain any CPU-specific, chipset specific, or platform specific information. Instead, the DXE core is abstracted from the system hardware through a set of architectural protocol interfaces. These architectural protocol interfaces are produced by DXE drivers 104, which are invoked by DXE Dispatcher 102.

Figure 2:
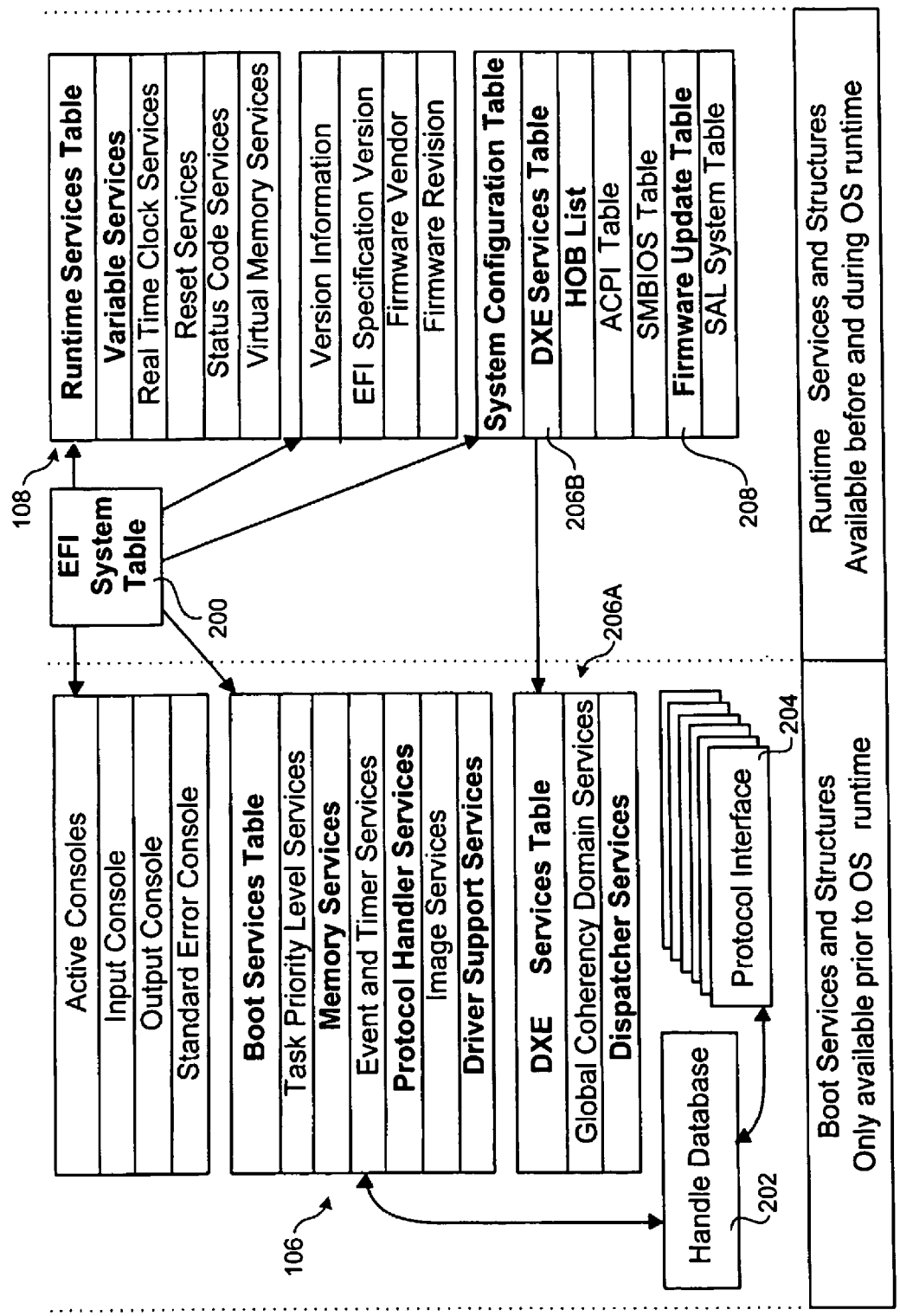
FIG. 2 is a block schematic diagram illustrating various components of the EFI system table that employed by embodiments of the invention during firmware variable access.

The DXE core produces an EFI System Table 200 and its associated set of Boot Services 106 and Runtime Services 108, as shown in FIG. 2. The DXE Core also maintains a handle database 202. The handle database comprises a list of one or more handles, wherein a handle is a list of one or more unique protocol GUIDs (Globally Unique Identifiers) that map to respective protocols 204. A protocol is a software abstraction for a set of services. Some protocols abstract I/O devices, and other protocols abstract a common set of system services. A protocol typically contains a set of APIs and some number of data fields. Every protocol is named by a GUID, and the DXE Core produces services that allow protocols to be registered in the handle database. As the DXE Dispatcher executes DXE drivers, additional protocols will be added to the handle database including the architectural protocols used to abstract the DXE Core from platform specific details.

The Boot Services comprise a set of services that are used during the DXE and BDS phases. Among others, these services include Memory Services, Protocol Handler Services, and Driver Support Services: Memory Services provide services to allocate and free memory pages and allocate and free the memory pool on byte boundaries. It also provides a service to retrieve a map of all the current physical memory usage in the platform. Protocol Handler Services provides services to add and remove handles from the handle database. It also provides services to add and remove protocols from the handles in the handle database. Addition services are available that allow any component to lookup handles in the handle database, and open and close protocols in the handle database. Support Services provides services to connect and disconnect drivers to devices in the platform. These services are used by the BDS phase to either connect all drivers to all devices, or to connect only the minimum number of drivers to devices required to establish the consoles and boot an operating system (i.e., for supporting a fast boot mechanism).

In contrast to Boot Services, Runtime Services are available both during pre-boot and OS runtime operations. One of the Runtime Services that is leveraged by embodiments disclosed herein is the Variable Services. As described in further detail below, the Variable Services provide services to lookup, add, and remove environmental variables from both volatile and non-volatile storage. As used herein, the Variable Services is termed "generic" since it is independent of any system component for which firmware is updated by embodiments of the invention.

The DXE Services Table includes data corresponding to a first set of DXE services 206A that are available during pre-boot only, and a second set of DXE services 206B that are available during both pre-boot and OS runtime. The pre-boot only services include Global Coherency Domain Services, which provide services to manage I/O resources, memory mapped I/O resources, and system memory resources in the platform. Also included are DXE Dispatcher Services, which provide services to manage DXE drivers that are being dispatched by the DXE dispatcher.

The services offered by each of Boot Services 106, Runtime Services 108, and DXE services 110 are accessed via respective sets of API's 112, 114, and 116. The API's provide an abstracted interface that enables subsequently loaded components to leverage selected services provided by the DXE Core.

After DXE Core 100 is initialized, control is handed to DXE Dispatcher 102. The DXE Dispatcher is responsible for loading and invoking DXE drivers found in firmware volumes, which correspond to the logical storage units from which firmware is loaded under the EFI framework. The DXE dispatcher searches for drivers in the firmware volumes described by the HOB List. As execution continues, other firmware volumes might be located. When they are, the dispatcher searches them for drivers as well.

There are two subclasses of DXE drivers. The first subclass includes DXE drivers that execute very early in the DXE phase. The execution order of these DXE drivers depends on the presence and contents of an a priori file and the evaluation of dependency expressions. These early DXE drivers will typically contain processor, chipset, and platform initialization code. These early drivers will also typically produce the architectural protocols that are required for the DXE core to produce its full complement of Boot Services and Runtime Services.

The second class of DXE drivers are those that comply with the EFI 1.10 Driver Model. These drivers do not perform any hardware initialization when they are executed by the DXE dispatcher. Instead, they register a Driver Binding Protocol interface in the handle database. The set of Driver Binding Protocols are used by the BDS phase to connect the drivers to the devices required to establish consoles and provide access to boot devices. The DXE Drivers that comply with the EFI 1.10 Driver Model ultimately provide software abstractions for console devices and boot devices when they are explicitly asked to do so.

Any DXE driver may consume the Boot Services and Runtime Services to perform their functions. However, the early DXE drivers need to be aware that not all of these services may be available when they execute because all of the architectural protocols might not have been registered yet. DXE drivers must use dependency expressions to guarantee that the services and protocol interfaces they require are available before they are executed.

The DXE drivers that comply with the EFI 1.10 Driver Model do not need to be concerned with this possibility. These drivers simply register the Driver Binding Protocol in the handle database when they are executed. This operation can be performed without the use of any architectural protocols. In connection with registration of the Driver Binding Protocols, a DXE driver may "publish" an API by using the InstallConfigurationTable function. This published drivers are depicted by API's 118. Under EFI, publication of an API exposes the API for access by other firmware components. The API's provide interfaces for the Device, Bus, or Service to which the DXE driver corresponds during their respective lifetimes.

The BDS architectural protocol executes during the BDS phase. The BDS architectural protocol locates and loads various applications that execute in the pre-boot services environment. Such applications might represent a traditional OS boot loader, or extended services that might run instead of, or prior to loading the final OS. Such extended pre-boot services might include setup configuration, extended diagnostics, flash update support, OEM value-adds, or the OS boot code. A Boot Dispatcher 120 is used during the BDS phase to enable selection of a Boot target, e.g., an OS to be booted by the system.

During the TSL phase, a final OS Boot loader 122 is run to load the selected OS. Once the OS has been loaded, there is no further need for the Boot Services 106, and for many of the services provided in connection with DXE drivers 104 via API's 118, as well as DXE Services 206A. Accordingly, these reduced sets of API's that may be accessed during OS runtime are depicted as API's 116A, and 118A in FIG. 1.

As shown in FIG. 1, the Variable Services persist into OS runtime. As such, the Variable Services API is exposed to the operating system, thereby enabling variable data to be added, modified, and deleted by operating system actions during OS runtime, in addition to firmware actions during the pre-boot operations. Typically, variable data are stored in the system's boot firmware device (BFD). In modern computer systems, BFDs will usually comprise a rewritable non-volatile memory component, such as, but not limited to, a flash device or EEPROM chip. As used herein, these devices are termed "non-volatile (NV) rewritable memory devices." In general, NV rewritable memory devices pertain to any device that can store data in a non-volatile manner (i.e., maintain (persist) data when the computer system is not operating), and provides both read and write access to the data. Thus, all or a portion of firmware stored on an NV rewritable memory device may be updated by rewriting data to appropriate memory ranges defined for the device.

Accordingly, a portion of the BFD's (or an auxiliary firmware storage device's) memory space may be reserved for storing persistent data, including variable data. In the case of flash devices and the like, this portion of memory is referred to as "NVRAM." NVRAM behaves in a manner similar to conventional random access memory, except that under flash storage schemes individual bits may only be toggled in one direction. As a result, the only way to reset a toggled bit is to "erase" groups of bits on a block-wise basis. In general, all or a portion of NVRAM may be used for storing variable data; this portion is referred to as the variable repository.

As discussed above, under EFI, variables are defined as key/value pairs that consist of identifying information plus attributes (the key) and arbitrary data (the value). These key/value pairs may be stored in and accessed from NVRAM via the Variable Services. There are three variable service functions: GetVariable, GetNextVariableName, and SetVariable. GetVariable returns the value of a variable. GetNextVariableName enumerates the current variable names. SetVariable sets the value of a variable. Each of the GetVariable and SetVariable functions employ five parameters: VariableName, VendorGuid (a unique identifier for the vendor), Attributes (via an attribute mask), DataSize, and Data. The Data parameter identifies a buffer (via a memory address) to write or read the data contents of the variable from. The VariableName, VendorGuid parameters enable variables corresponding to a particular system component (e.g., add-in card) to be easily identified, and enables multiple variables to be attached to the same component.

Under a database context, the variable data are stored as 2-tuples $<M_i, B_i>$, wherein the data bytes (B) are often associated with some attribute information/metadata (M) prior to programming the flash device. Metadata M is implementation specific. It may include information such as "deleted", etc., in order to allow for garbage collection of the store at various times during the life of the variable repository. Metadata M is not exposed through the Variable Services API but is just used internally to manage the store.

In accordance with aspects of the invention, the foregoing variable data storage and access scheme is augmented in a manner that supports compression of variables for storage and a corresponding decompression of the compressed variables when it is desired to access the variables. In connection with database terminology, the 2-tuple storage scheme is augmented by compressing B (the data) through a compression function C and adding compression-related information to the metadata M to yield $<M', C(B)>$. For example, M' may include additional information identifying whether a give variable is compressed (e.g., a Boolean value indicating "Compressed/Not-compressed") and/or identifying a particular compression algorithm that was employed, such as "Compression Algorithm XYZ."

In addition to compressing variable data, there is a requisite need for a decompressor to return the data back to its original form. For instance, retrieval of C(B) via a decompressor D is represented as D(C(B)). Under today's computing platform environments, it is common to store various portions of firmware in a compressed manner to maximum storage utility. As a result, a decompressor D is already provided for such configurations to decompress the compressed firmware. Furthermore, if the same compression/decompression scheme is employed for both the firmware portions and the variable data, there is no need to provide a second decompressor with the firmware. Alternatively, separate compression/decompression schemes may be employed for storing the firmware and storing the variable data. In this instance, a separate decompressor will be provided with the firmware.

In contrast, it is uncommon for a compressor to be provided with firmware. The reason for this is that compressed firmware is typically uncompressed and then loaded into memory for subsequent use. A good portion of the use of the uncompressed firmware is for performing system initialization operations which, when completed, no longer require the underlying firmware code to be available. In order to support operation system runtime operations, the uncompressed firmware code needs to merely remain in memory, along with appropriate interface information being passed to the OS.

In accordance with another aspect of the invention, "eager" compression is employed. More particularly, variable data are stored in a compressed form when a compressor is available, while variable data are stored in a uncompressed form if the compressor is non available. As a result, upon a SetVariable (B) transaction, if there exists a compressor algorithm C in the firmware, then C(B) is stored; otherwise B is stored in a manner similar to the conventional scheme.

In one embodiment, the compressor code (a.k.a. the compressor) is located in a non-fault tolerant block (typically reserved for fault-tolerant updates), meaning it may be lost without causing the overall variable data access scheme to fail. For example, the compressor code could be lost in the advent of a power-failure during a fault-tolerant update operation. This is not critical, as any existing compressed variable data can still be decompressed, and any future storage of variable data will be performed in the conventional manner, i.e., the data will be stored in the aforementioned $<M_i, B_i>$ 2-tuple format. By storing the compressor code outside of the blocks typically reserved for platform firmware, there is no impact on the memory space utilization of the firmware storage device when compared to the traditional approach.

With reference to the flowcharts of FIGS. 3a and 3b and the schematic diagram of FIG. 4, platform initialization operations in accordance with one embodiment proceed as follows. The process is initiated in response to a system reset or power on event, as depicted by a start block 300. In response, the process proceeds through early platform initialization in a block 302 in accordance with the PEI phase discussed above with reference to FIG. 1. In further detail, firmware stored in the system's BFD firmware device, such as an exemplary 512K flash device 400 shown in FIG. 4, is executed to perform the early initialization. In one embodiment this firmware is stored uncompressed in a recovery block 402 of flash device 400, and executed in place (XIP). A recovery block contains firmware that is never changed; in contrast, other portions of the flash device comprise blocks containing firmware that may be updated via appropriate update operations.

Under the EFI environment, firmware executed during the PEI phase are stored in modules called "PEI modules" or "PEIMs" for short. First, in response to the reset/power on event, a 32-bit processor such as processors having an Intel 32-bit architecture (IA-32) loads a reset instruction located at the 4 gigabyte (GB) 32-bit address space ceiling. This corresponds to the highest address of the system's BFD. Accordingly, the base address of the BFD is equal to 4 GB minus the memory size of the device, e.g., 512K for flash device 400. In accordance with a 64K block size for recovery block 402, the reset instruction vectors the instruction execution path to the first instruction at the address 16K below 4 GB (i.e., the base address of the flash device 400 plus 596K). This coincides with the location of an Security module (SEC file) 404 that contains instructions for verifying the integrity of various firmware components that are to be loaded; these instructions are executed in place during an SEC phase that is performed prior to the PEI phase shown in FIG. 1. At the completion of the SEC phase, the execution path is vectored to the start of a PEI core file 406.

The remaining firmware in recovery block 402 is then executed in place in order, from lower to higher block addresses, wherein the starting address for each module is stored in a firmware volume (FV) header 407. This includes execution of PEI core file 406, memory and platform initialization PEIMs 408 and 410, and a DXE initial program load (IPL) PEIM 412. Execution of the memory initialization PEIM enables access to the system's memory, depicted as system memory 414. In one embodiment, the system reserves an address space immediately below the base address of the BFD for firmware "shadowing," that is storing executable firmware images in system memory for faster access and/or decompression purposes as explained below. This portion of system memory 414 is shown as firmware images and API's 416.

In connection with the execution of DXE IPL PEIM 412, the module is loaded into firmware images and API's 416 (i.e., shadowed) and configuration information is generated such that the entry point of a decompression function corresponding to a decompressor 418 is passed to DXE via an HOB. Subsequently, the remaining firmware in recovery block 402 is executed, including block access and file system recovery PEIMs 420 and a variable access PEIM 422, completing the PEI phase. The variable access PEIM enables access to variables 424 stored in NVRAM block 426 during the PEI phase.

Next, the instruction execution path is redirected to firmware contained in the firmware volume located near the base address of flash device 400. This portion of firmware typically comprises components that are executed during the DXE phase, such as DXE drivers and related code, which are collectively depicted as being stored in replaceable firmware blocks 428 (shown as a single block for simplicity). The address range occupied by the replaceable firmware blocks starts with the base address for the device and extends to the base address plus 320K, i.e., the first five 64K blocks of firmware device 400. The starting address for each component is contained within a FV header 430.

During the DXE phase, various DXE-related firmware components are loaded into system memory and executed. These components include a DXE core file 432, a chipset DXE driver 434, a console DXE driver 425, a variable DXE driver 438, a compatibility support DXE driver 440, and an EFI shell application 442. Several other DXE components are also loaded and executed; these are not shown in FIG. 4 for clarity. Under one embodiment, the firmware stored in replaceable firmware blocks 428 is compressed. Thus, in order to execute the foregoing DXE components, they must first be decompressed prior to being loaded into system memory (at firmware images and API's 416). This is accomplished, in part, via decompressor 418. For clarity, the decompressed images of many of the DXE-related firmware components are not shown in firmware images and API's 416.

In conjunction with the decompression, loading, and execution of variable DXE driver 438, a variable services API 444 is published. This API enables access (i.e., reading and writing) to variables 424 during the remaining pre-boot operations and during OS runtime.

In addition to identifying the location (i.e., starting address) of each of the firmware components in replaceable blocks 428, FV header 430 also contains indicia identifying the location of a compressor DXE driver 446 stored in a reclaim block 448. In general, the reclaim block is used to temporarily store a copy of a given block of firmware during a fault-tolerant firmware upgrade process. Thus, it does not normally contain any required firmware components, since its contents are designed to be erased and then rewritten during firmware upgrades. However, in this instance, the reclaim block is used to store the compressor DXE driver. Alternatively, compressor DXE driver 446 may be stored in either recovery block 402 or replaceable firmware blocks 430. In general, compressor DXE driver 446 may be stored in a compressed or uncompressed format, depending on its size and any other firmware that is stored in reclaim block 448.

Upon being loaded into system memory, compressor DXE driver exposes a decompression protocol 448 that is imported into variable services API 444. The decompression protocol apprizes the variable services of how compressed variables 424 are to be decompressed.

Figure 3A:
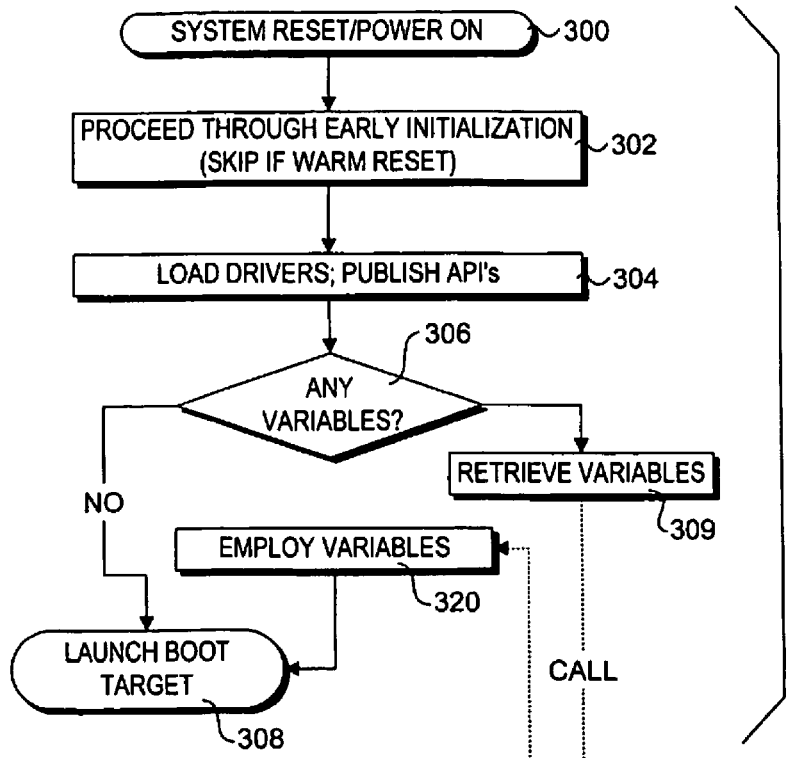
FIG. 3a is a flowchart illustrating logic and operations performed to load firmware variables during system initialization in accordance with one embodiment of the invention.
Figure 3B:
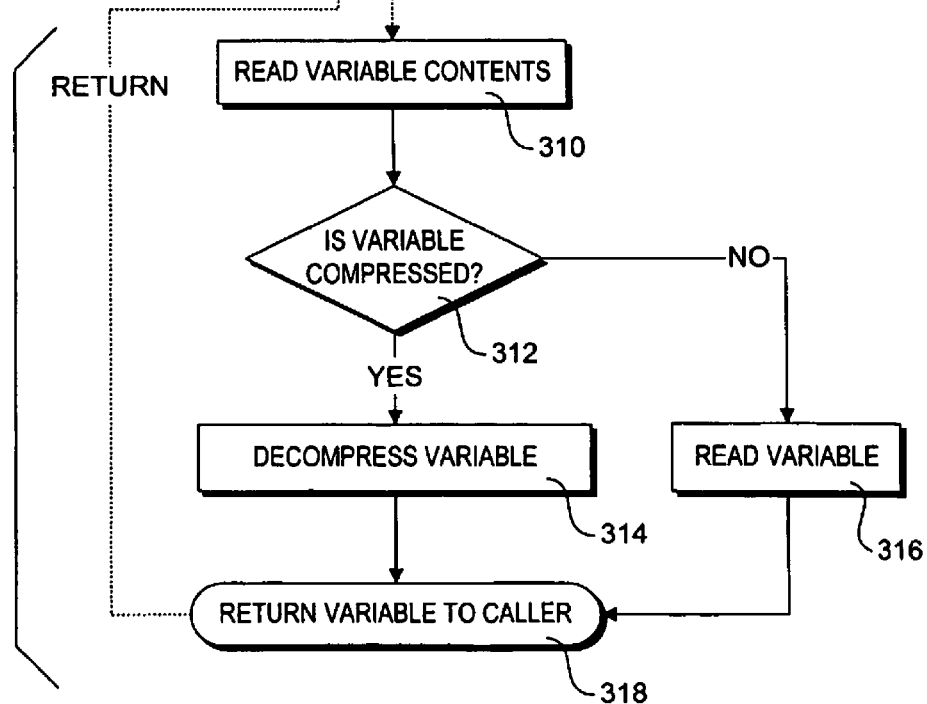
FIG. 3b is a flowchart illustrating logic and operations performed during a firmware variable read process in accordance one embodiment of the invention.
Figure 4:
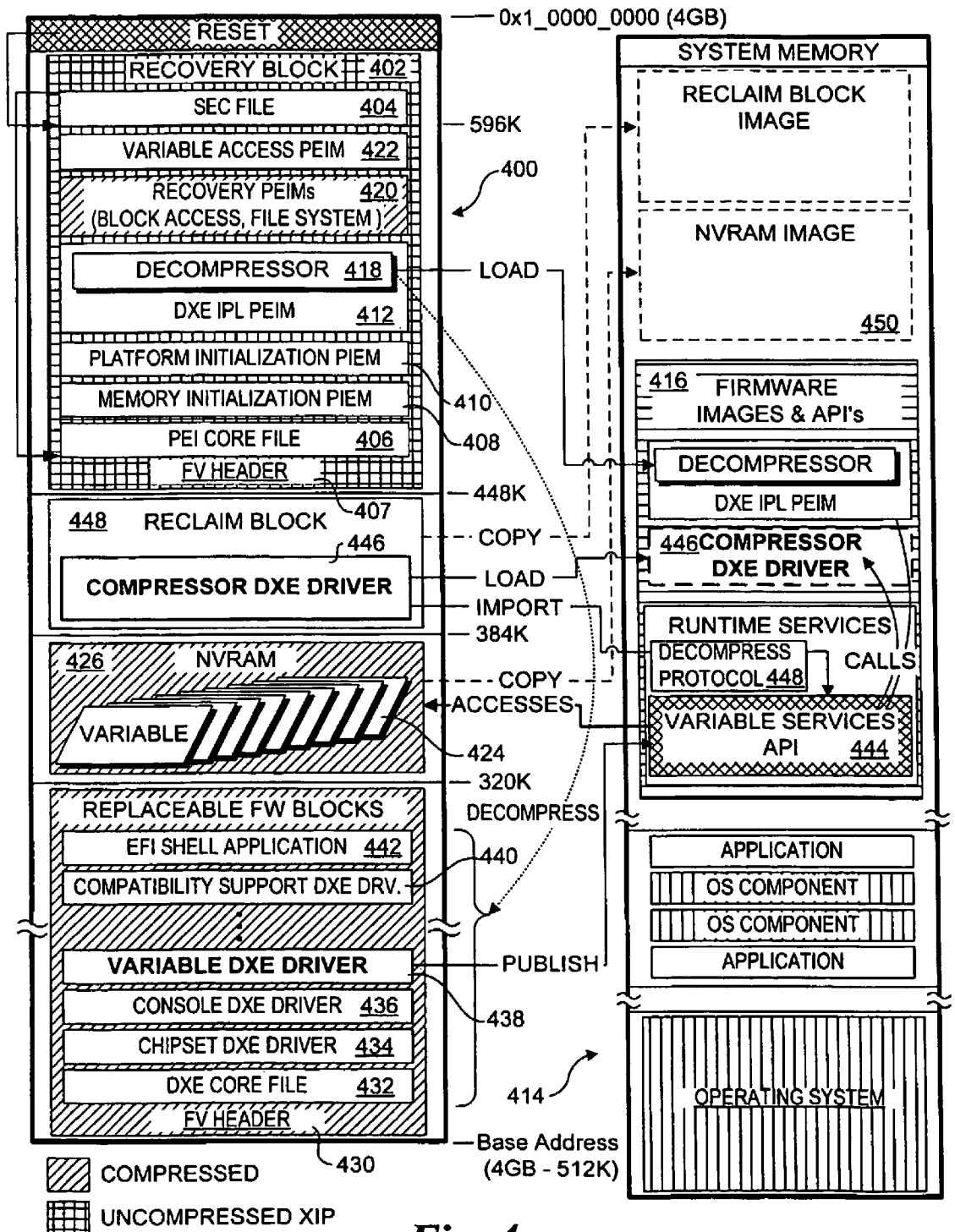
FIG. 4 is a schematic diagram illustrating the configuration of firmware components for supporting compression/decompression operations in accordance with one embodiment of the invention.

Returning to the flowchart of FIG. 3a, after the operations of block 304 are performed, a determination is made in a decision block 306 to whether an variables 424 exist in NVRAM block 426. If the answer is no, the pre-boot operations continue until a boot target (e.g., an operating system loader) is launched in an end block 308. If variables do exists, the logic proceeds to the flowchart of FIG. 3b to retrieve the variables in accordance with a block 309.

This process begins in a block 310 in which the variable contents are read by calling the GetNextVariableName and augmented GetVariable functions. In particular, the GetVariable function examines metadata M' in a decision block 312 to determine if a currently considered variable is stored in a compressed format. If the variable is compressed, the variable is decompressed using decompressor 418 as depicted in a block 314. If the variable is not compressed, it is simply read in a block 316. In either case, the variable is returned to the caller in accordance with an end block 318.

After any variables have been retrieved, they are employed by appropriate firmware components in a block 320. For example, variables may be employed for providing various boot options to a user. Subsequently, the logic proceeds to end block 308 to launch the boot target.

In addition to retrieving variables, new variable data may be added and existing variable data may be modified or deleted. This is done via the SetVariable function in accordance with the flowchart of FIG. 5. In a block 500 the variable contents are provided as the Data parameter to the augmented SetVariable function via a corresponding call to variable services API 444. In a decision block 502 a determination is made to whether a compressor exists. If the answer is YES, the variable is compressed via DXE driver compressor 446 in a block 504. Whether the compressor exists or not, a determination is made in a decision block 506 to whether enough space is left in the variable store (e.g., NVRAM block 426) to store the compressed or uncompressed variable. If the remaining space is adequate, the variable is written to the variable store in a compressed or uncompressed form, depending on the existence of a compressor. The process then exits successfully in accordance with a return block 510, returning to the caller. If the remaining space is in the variable store is inadequate, the process exits in accordance with a return block 512 and returns error indicia to the caller.

In the case of an updated variable, the write process involves two steps. Since the bits of flash memory cannot be reset without erasing an entire block, a variable update is performed by first marking an existing variable as deleted via setting corresponding bits in the metadata M or M' (as appropriate). Then, the new variable data are written to the variable store.

Figure 6:
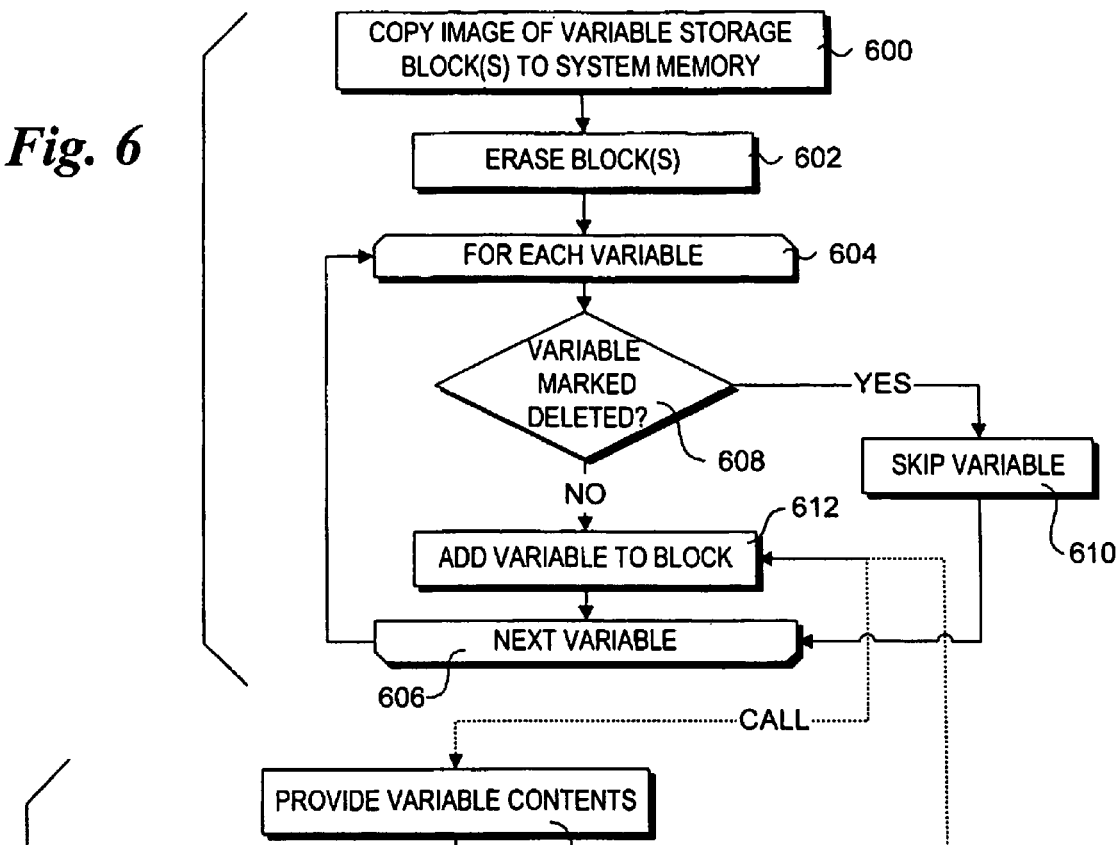
FIG. 6 is a flowchart illustrating logic and operations performed during a firmware variable coalescing process in accordance one embodiment of the invention.

It will be appreciated that over time various deleted variable data will accumulate in the variable store, thereby reducing the remaining space for storing new and/or additional modified variable data. In one embodiment the deleted variable data may be "garbage collected" in accordance with the flowchart of FIG. 6. First, in a block 600, an image of the block or blocks for which garbage collection is to be effectuated (e.g., NVRAM block 426) is copied into system memory 414, as depicted by NVRAM image 450. The block or blocks of flash memory is/are then erased in a block 602. The operations shown between respective start and end loops block 604 and 606 are then performed for each variable. The first operation corresponds to a decision block 608 in which a determination is made to whether the currently-processed variable is marked as deleted. If it is marked as deleted, the variable is skipped in accordance with a block 610, and the process moves on to consider the next variable. For each variable that is not marked as deleted, the variable is added to the firmware variable store in a block 610. This process involves calling the augmented SetVariable function for each non-deleted variable to write the variable to the variable store by performing the operations discussed above with reference to FIG. 5. This process is repeated until the end of the block image is reached.

In accordance with another aspect of the invention, firmware may be configured to perform a restart time compression scan in response to a firmware update via which the compressor is added. For example, a compression scan may be employed to compress existing variable data stored previously stored in the firmware device in an uncompressed form.

Figure 7:
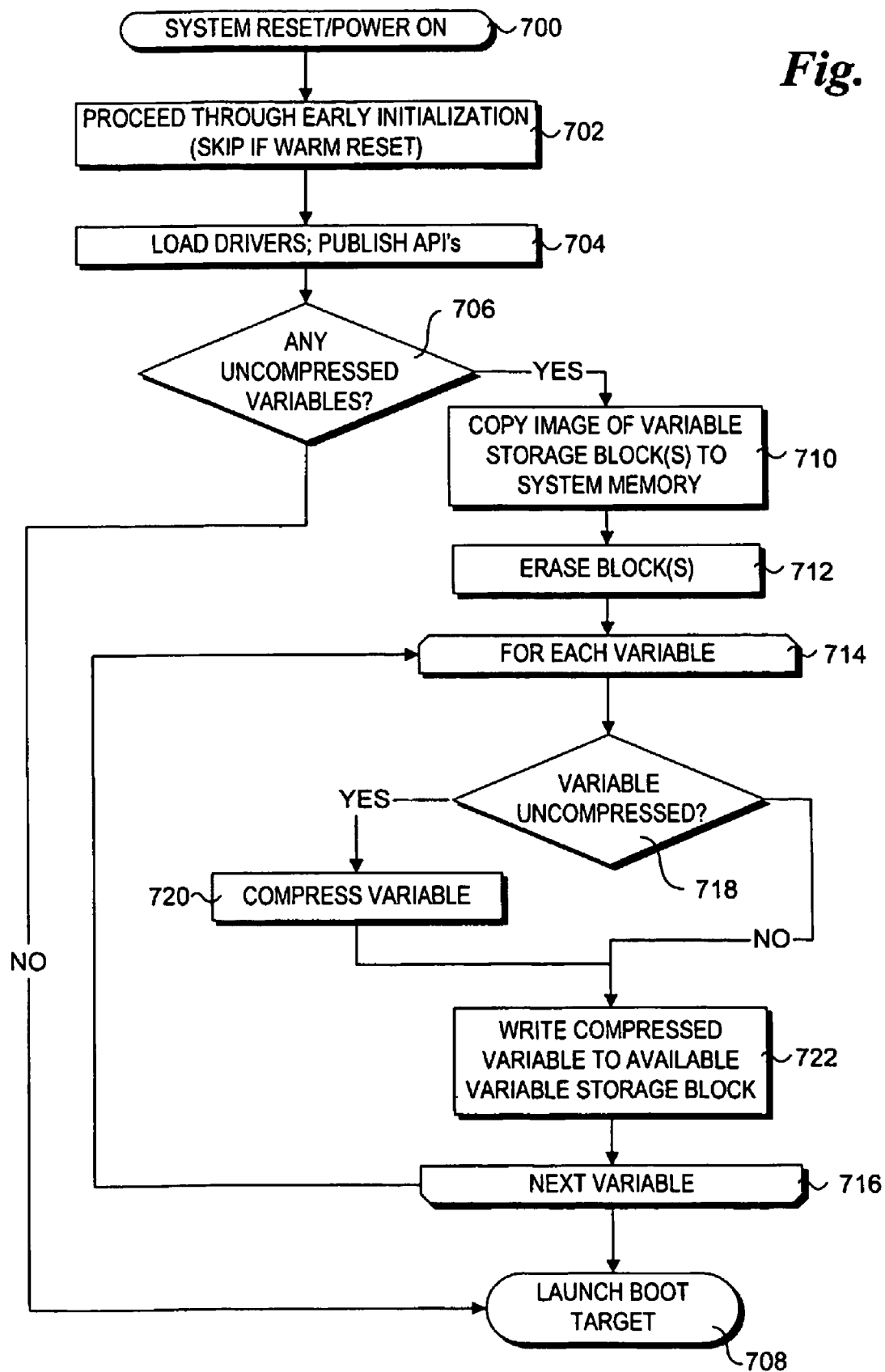
FIG. 7 is a flowchart illustrating logic and operations performed during a restart variable compression scan process in accordance one embodiment of the invention.

A flowchart illustrating operations and logic performed in accordance with one embodiment for performing a restart time compression scan is shown in FIG. 7. The process begins in a similar manner to that discussed above with FIG. 3, wherein the operations of blocks 700, 702, and 704 are analogous with those of blocks 300, 302, and 304, respectively. Subsequently, a determination is made in a decision block 706 to whether any uncompressed variables exist. If the answer is NO, the pre-boot initialization process continues, eventually leading to a boot target launch in a block 708.

If it is determined that uncompressed variables exist, the logic proceeds to a block 710 in which an image of the variable storage block(s) (e.g., NVRAM block 426) is copied into system memory. The variable storage block(s) is/are then erased in a block 712. Each variable is then processed by the operations defined by start and end blocks 714 and 716. First, a determination is made in a decision block 718 to whether a currently-processed variable is uncompressed. If the variable is uncompressed, it is compressed in a block 720 and written to the variable storage block (or an available block if multiple variable storage blocks are employed, wherein in one embodiment a first block is written to until it is filled, and then a second block is written to until it is filled, etc.) in a block 722. If the variable is already compressed, it is simply written in its compressed form to the variable storage block in block 722. This process is repeated until all variables have been processed, whereupon the pre-boot initialization operations are continued leading to launch of the boot target in block 708.

In accordance with another aspect of the invention, a scheme similar to that described above for compression/decompression may be applied for encryption/decryption of variables. In one embodiment, encryption and decryption of variables is used alone. In another embodiment, compression/decompression and encryption/decryption are combined in parallel.

Figure 8:
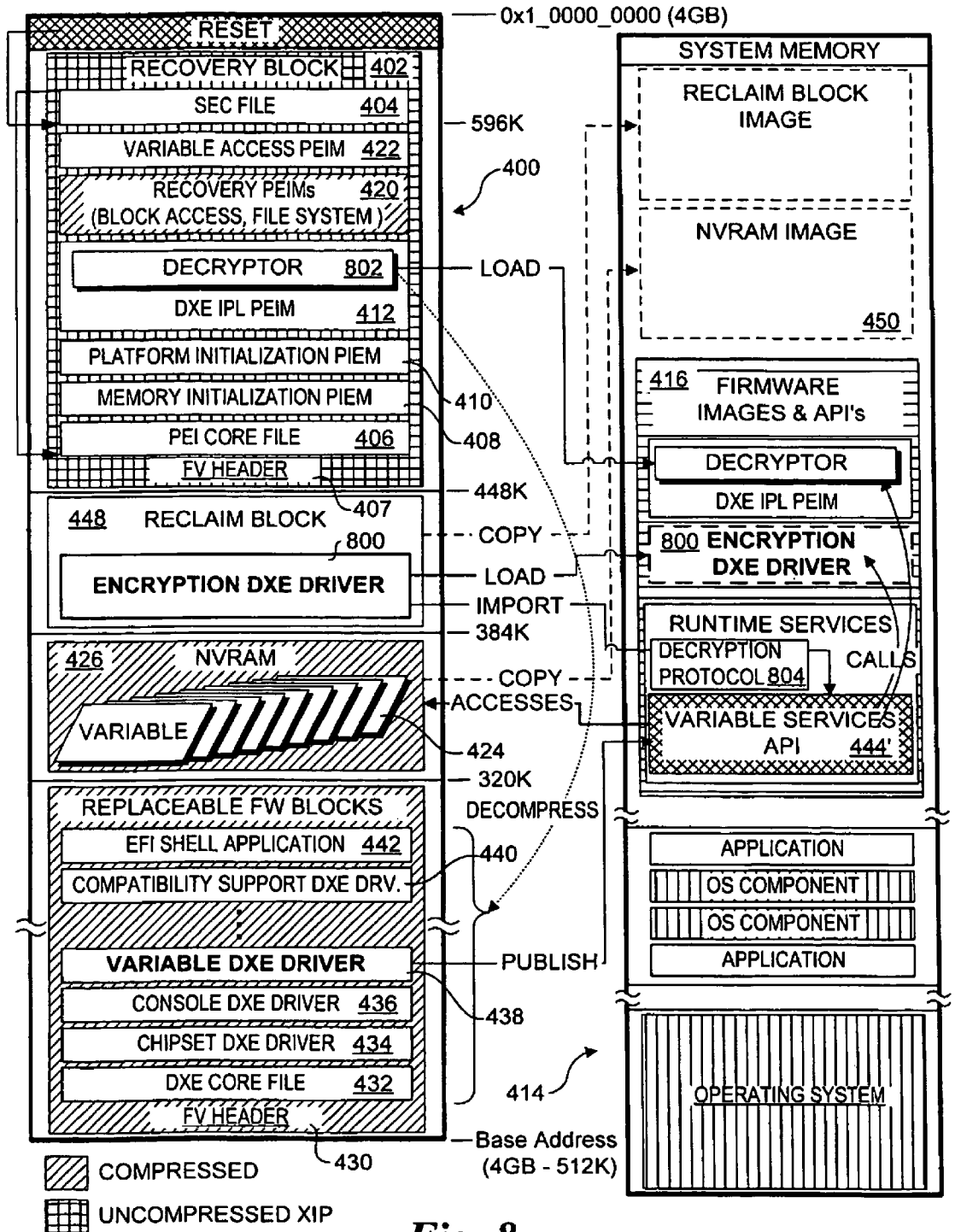
FIG. 8 is a schematic diagram illustrating the configuration of firmware components for supporting encryption/decryption operations in accordance with one embodiment of the invention.

With reference to FIG. 8, an exemplary firmware configuration supporting encryption and decryption of firmware variable data contains similar components shown in FIG. 4, except for addition of an encryption DXE driver 800 stored in reclaim block 448, a decryptor 802 that is provided with DXE IPL PEIM 412, and a decryption protocol 804 that is imported by Variable services API 444'. In general, the encryption DXE driver may be located anywhere in memory, such as in a non-fault tolerant block, while the decryptor should be located in a non-replaceable block, such as recovery block 402. In the embodiment that combines compression/decompression and encryption/decryption in parallel, both encryption DXE driver 800 and compressor DXE driver 446 reside in reclaim block 448, while both decryptor 802 and decompressor 418 reside in recovery block 402 (not shown).

Figure 9A:
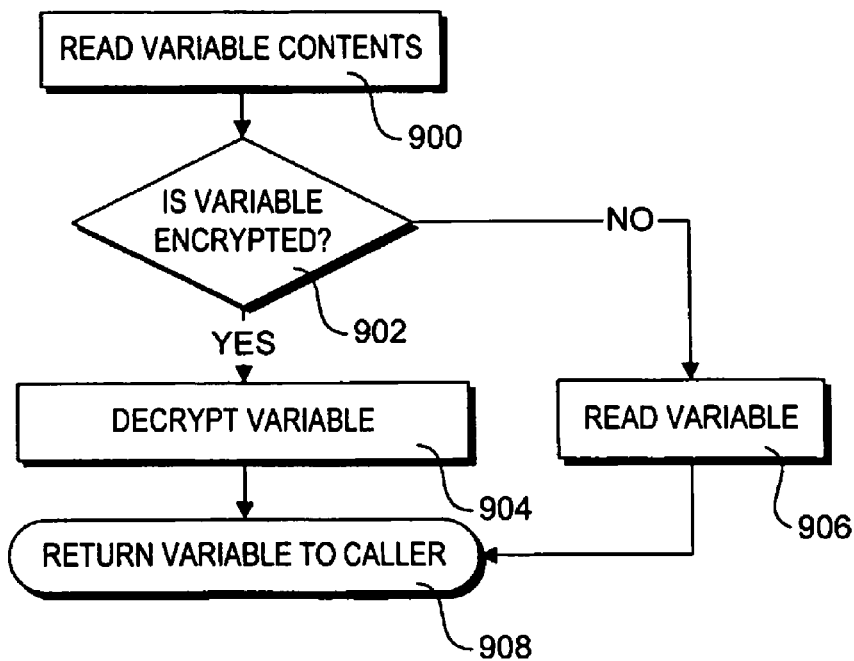
FIG. 9a is a flowchart illustrating logic and operations performed during a firmware variable read operation in which encrypted and unencrypted variables may be retrieved in accordance with one embodiment of the invention.

In essence, encryption DXE driver 800, and decryptor 802 function in an analogous manner to compressor DXE driver 446 and decompressor 418, respectively. In this case, metadata M" contains indicia indicating whether a variable is encrypted or not, and the data are stored as 2-tuples having a form of <M"i, E(Bi)>. For example, read operations employing encryption/decryption alone are shown in FIG. 9a. This process begins in a block 900 in which the variable contents are read by calling the GetNextVariableName and augmented GetVariable functions. In particular, the GetVariable function examines metadata M" in a decision block 902 to determine if a currently considered variable is stored in a encrypted form. If the variable is encrypted, the variable is decrypted using decryptor 802 as depicted in a block 904. If the variable is not encrypted, it is simply read in a block 906. In either case, an unencrypted variable is returned to the caller in an end block 908.

Figure 9B:
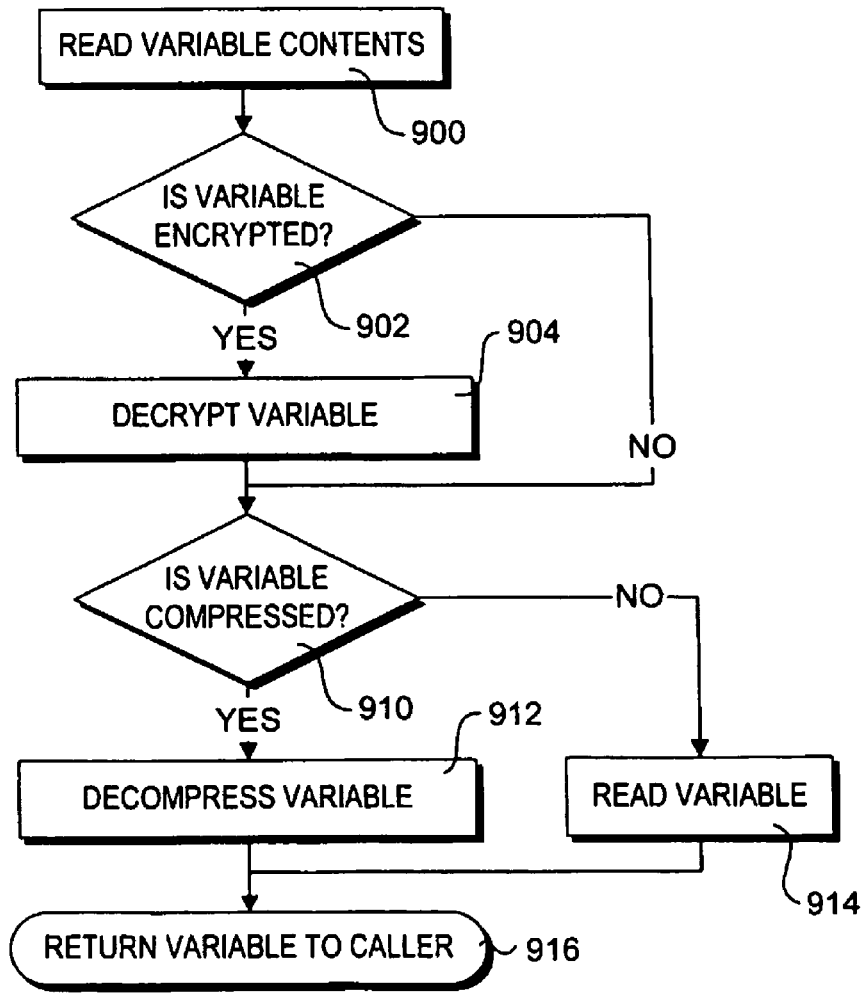
FIG. 9b is a flowchart similar to FIG. 9a further adding compression/decompression operations to enable encrypted/unencrypted and compressed/uncompressed variables to be retrieved in accordance with one embodiment of the invention.

The flowchart of FIG. 9b shows operations and logic in accordance with one embodiment in which compression and decompression operations are added to the flowchart of FIG. 9a. In this instance, the operations of blocks 900, 902, and 904 are performed in the same manner described above, yielding an unencrypted variable. Next, a determination is made in a decision block 910 to whether the unencrypted variable is compressed. If so, the unencrypted variable is decompressed in a block 912; otherwise it is simply read in a block 914. The resulting unencrypted and uncompressed variable is then returned to the caller in an end block 916.

Figure 5:
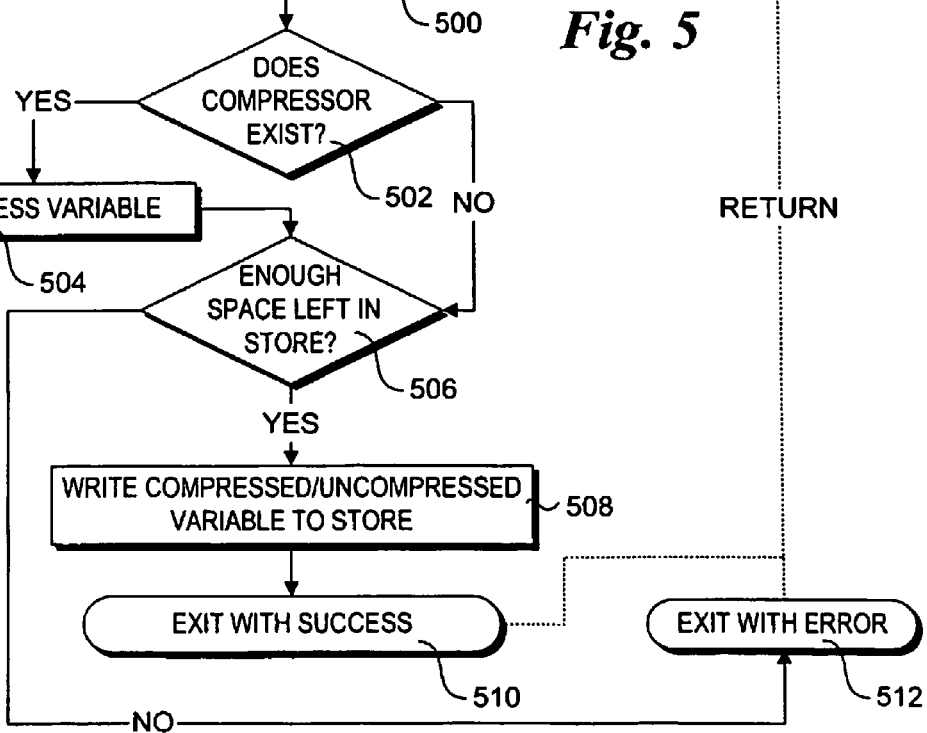
FIG. 5 is a flowchart illustrating logic and operations performed during a firmware variable write process under which variables are stored using eager compression in accordance one embodiment of the invention.

Writing variables to the firmware store under the encryption decryption scheme is analogous to that discussed above for compression/decompression with reference to FIG. 5. In a block 1000 the variable contents are provided as the Data parameter to an augmented SetVariable function via a corresponding call to variable services API 444'. In a decision block 1002, a determination is made to whether an encryptor exists. If the answer is YES, the variable is encrypted via compressor DXE driver 800 in a block 1004. Whether the encryptor exists or not, a determination is made in a decision block 1006 to whether enough space is left in the variable store (e.g., NVRAM block 426) to store the encrypted or unencrypted variable. If the remaining space is adequate, the variable is written to the variable store in an encrypted or unencrypted form, depending on the existence of an encryptor. The process then exits successfully in accordance with a return block 1010, returning to the caller. If the remaining space in the variable store is inadequate, the process exits in accordance with a return block 1012 and returns error indicia to the caller.

Figure 10A:
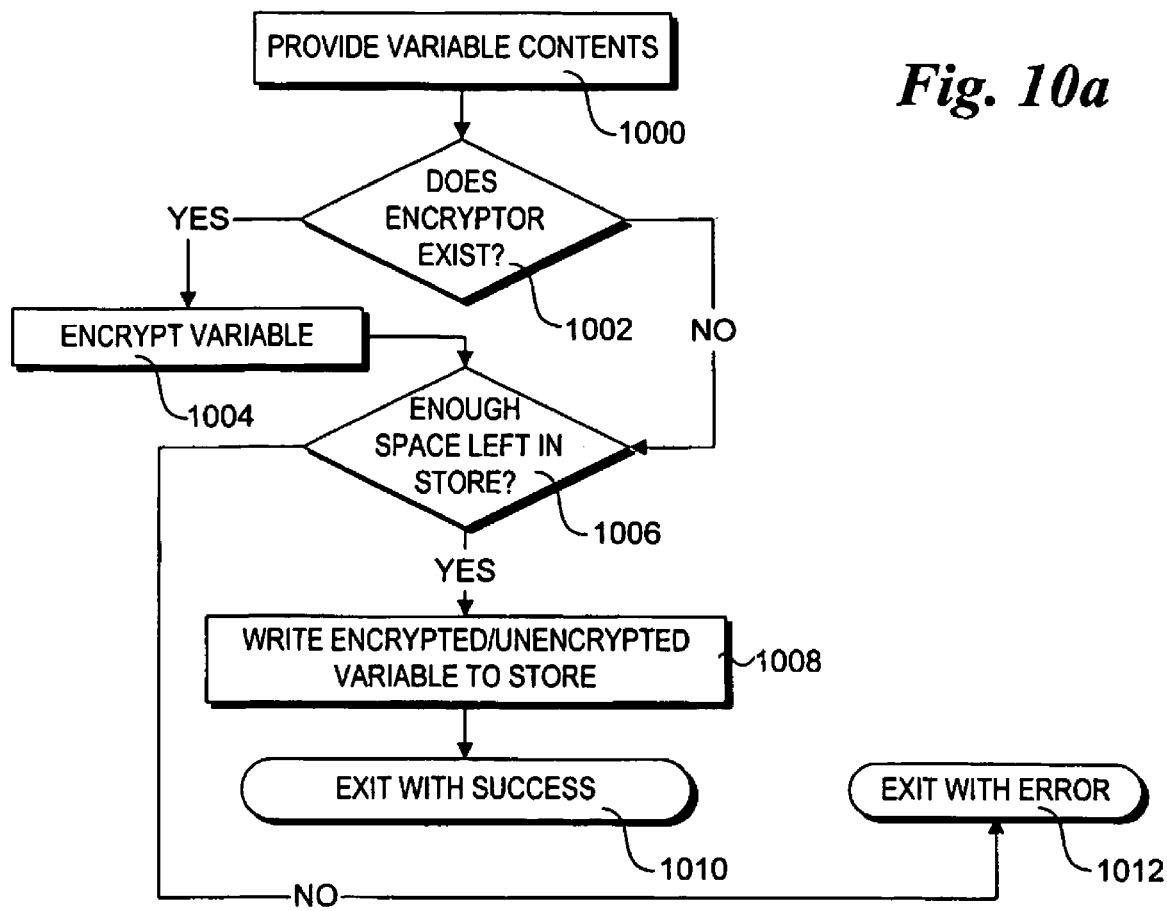
FIG. 10a is a flowchart illustrating logic and operations performed during a firmware variable write process under which variables are stored using eager encryption in accordance one embodiment of the invention.
Figure 10B:
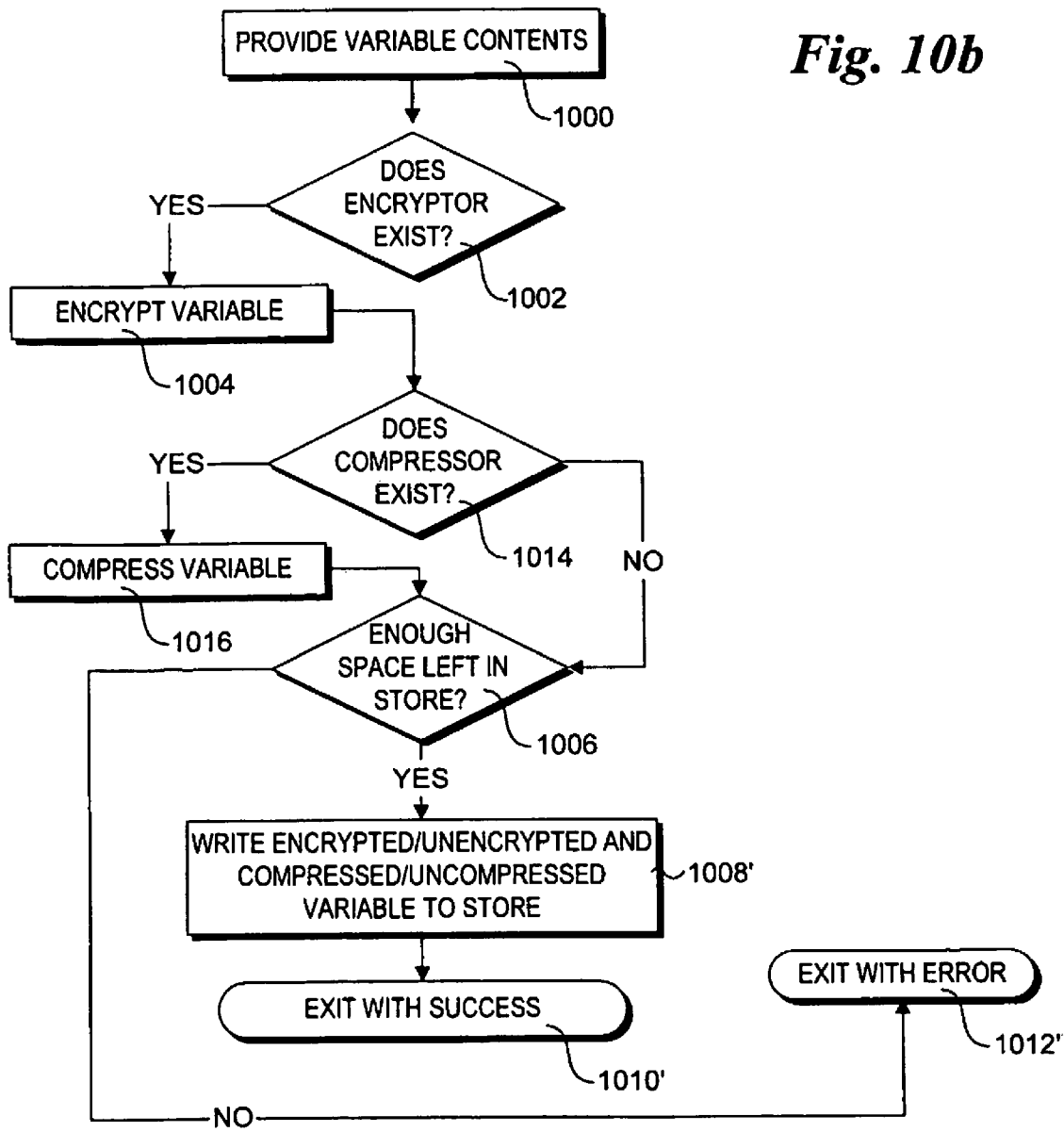
FIG. 10b is a flowchart illustrating logic and operations performed during a firmware variable write process under which variables are stored using a combination of eager encryption and eager compression in accordance one embodiment of the invention.

The flowchart of FIG. 10b shows operations and logic in accordance with one embodiment in which compression and decompression operations are added to the flowchart of FIG. 10a. In this instance, the operations of blocks 1000, 1002, and 1004 are performed in the same manner described above, yielding an encrypted variable if an encryptor exists, otherwise yielding an unencrypted variable. A determination is then made in a decision block 1014 to whether the encrypted/unencrypted variable is compressed. If so, the variable is compressed in a block 1016 and the logic flows to a decision block 1006'; otherwise it proceeds directly to decision block 1006'. If there is enough space left in the store to store the encrypted/unencrypted and compressed/uncompressed variable, it is stored in a block 1008' and the process exits successfully in a return block 1010', returning to the caller. The resulting unencrypted and uncompressed variable is then returned to the caller in an end block 916. If the remaining space in the variable store is inadequate, the process exits in a return block 1012' and returns error indicia to the caller.

In the foregoing embodiments, variables are first encrypted and then compressed. This is merely an exemplary ordering, as variables could be first compressed and then encrypted. In one embodiment, a symmetric encryption scheme, such as defined by the Advanced Encryption Standard (AES) agency's federal information processing standard (FIPS) 197 (http:/csrc.nist.gov/publications/fips/fips197/fips-197.pdf).

In general, the principles of the invention may be applied to any type of firmware variable conversion in a similar manner to that described herein for compression and encryption. For example, the variables may be converted to contain error correction code (ECC) data to guard against lost bits. In another embodiment, a conversion in accordance with a digital signature scheme could be employed for security purposes. Furthermore, multiple converters may be implemented in parallel, such as illustrated by a function $\mathcal{F}=C_1(C_2(C_3))\ldots$ etc, wherein $C_1, C_2$ and $C_3$ are respective conversion functions. The conversion analogy also applies to fail-safe eager conversion, as follows. First, if a converter is available it is used to convert the variables, otherwise conversion is disregarded. Second, the deconverter (i.e., the component used for returning a firmware variable stored in a converted form back to its unconverted form) should be stored in a fail-safe manner, such as in recovery block 402. As before, in one embodiment that converter is stored in a non-fault tolerant block of the firmware devices such that it may be lost. Since the deconverter is safely stored, it will still be available for retrieving the variable data.

It is further to be understood that the particular conversion scheme employed will be known to those skilled in the particular conversion art (compression, encryption, ECC, digital signatures, etc.). Accordingly, further details of the particular conversion processes are not included herein in order to not obscure the invention.

Exemplary Computer System for Practicing Embodiments of the Invention

Figure 11:
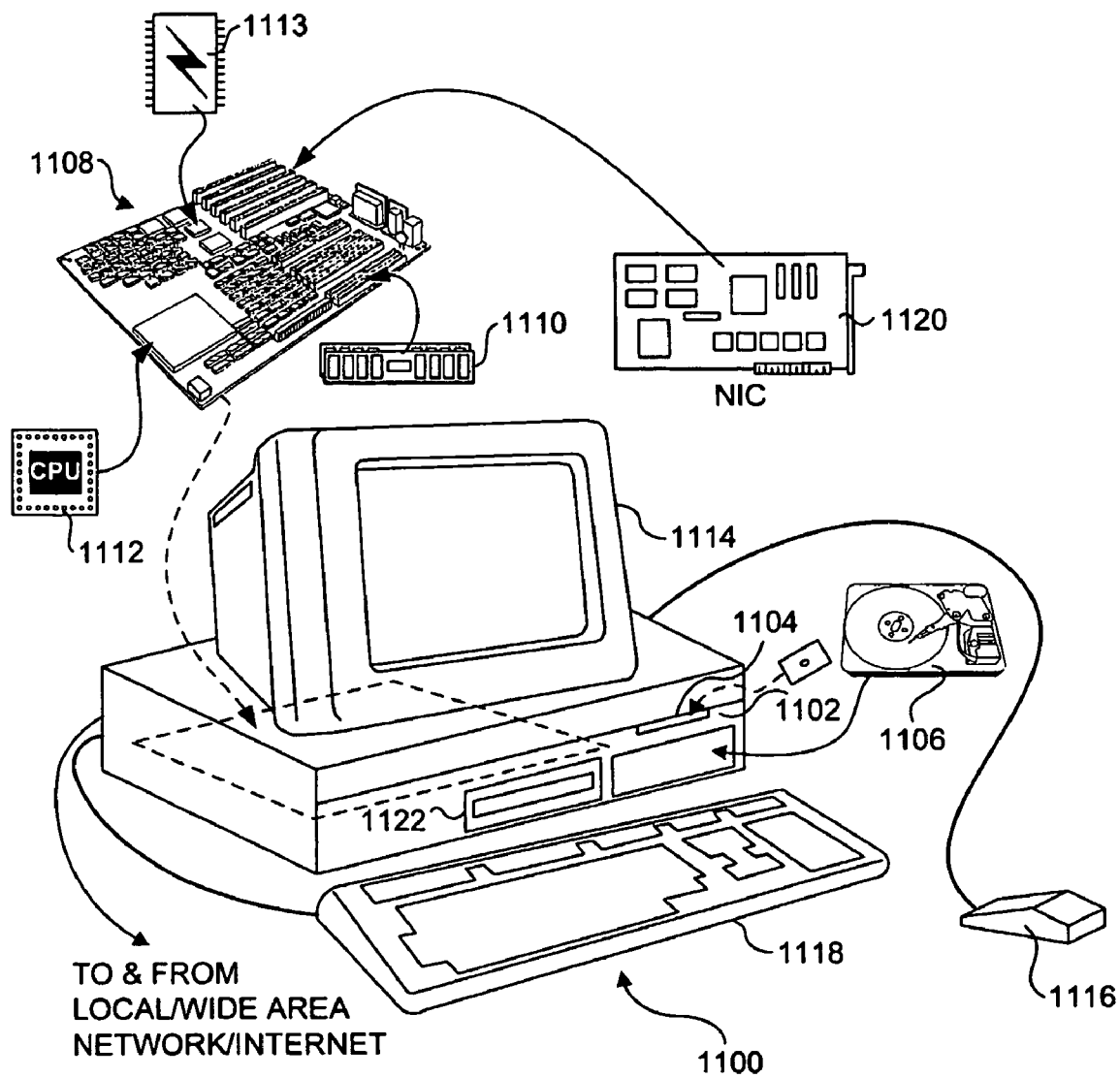
FIG. 11 is a schematic diagram illustrating an exemplary computer system that may be employed for implementing the embodiments of the invention disclosed herein.

With reference to FIG. 11, a generally conventional computer 1100 is illustrated, which is suitable for use as a computing platform in connection with practicing embodiments of the present invention. Examples of computers that may be suitable for implementing embodiments as discussed above include PC-class systems, portable computers, servers and workstations Computer 1100 includes a processor chassis 1102 in which are mounted a floppy disk drive 1104, a hard drive 1106, a motherboard 1108 populated with appropriate integrated circuits including memory 1110, one or more processors (CPUs) 1112, firmware storage device 1113, and a power supply (not shown), as are generally well known to those of ordinary skill in the art. It will be understood that hard drive 806 may comprise a single unit, or multiple hard drives, and may optionally reside outside of computer 1100. A monitor 1114 is included for displaying graphics and text generated by software programs and program modules that are run by the computer. A mouse 1116 (or other pointing device) may be connected to a serial port (or to a bus port or USB port) on the rear of processor chassis 1102, and signals from mouse 1116 are conveyed to the motherboard to control a cursor on the display and to select text, menu options, and graphic components displayed on monitor 1114 by software programs and modules executing on the computer. In addition, a keyboard 1118 is coupled to the motherboard for user entry of text and commands that affect the running of software programs executing on the computer. Computer 1100 also includes a network interface card 1120 or built-in network adapter for connecting the computer to a computer network, such as a local area network, wide area network, or the Internet.

Computer 1100 may also optionally include a compact disk-read only memory (CD-ROM) drive 1122 into which a CD-ROM disk may be inserted so that executable files and data on the disk can be read for transfer into the memory and/or into storage on hard drive 1106 of computer 1100. Other mass memory storage devices such as an optical recorded medium or DVD drive may be included.

The machine instructions comprising the software that causes the CPU to implement the functions of the present invention that have been discussed above will likely be distributed on floppy disks or CD-ROMs (or other memory media) and stored in the hard drive until loaded into random access memory (RAM) for execution by the CPU. Optionally, all or a portion of the machine instructions may be loaded via a computer network.

The firmware instructions stored on firmware storage device 1113 that may be executed by processor 1112 to perform the various firmware operations discussed above will generally be stored on corresponding non-volatile rewritable memory devices, such as flash devices, EEPROMs, and the like. The firmware embodied as a carrier wave may also be downloaded over a network and copied to a firmware device (e.g., "flashed" to a flash device), or may be originally stored on a disk media and copied to the firmware device.

Thus, embodiments of this invention may be used as or to support firmware and software instructions executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such storage means such as a read only memory (ROM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
   receiving a request to store a first firmware variable;
   determining if a compressor stored in a non-fault tolerant portion of a firmware storage device is available for compressing the first firmware variable; and
   employing the compressor if it is available to compress the first firmware variable and storing the first firmware variable in a compressed form in a firmware storage device, the first firmware variable in the compressed form to be decompressed via a decompressor stored in a fault-tolerant portion of the firmware storage device, otherwise storing the first firmware variable in an uncompressed form in the firmware storage device if the compressor is not available.

2. The method of claim 1, further comprising:
   receiving a request to store a second firmware variable;
   determining the compressor is no longer available; and
   storing the second firmware variable in the firmware storage device in an uncompressed form.

3. The method of claim 1, wherein uncompressed firmware variables are stored in a 2-tuple format of $<M_i, B_i>$, wherein $M_i$ comprises metadata corresponding to an ith tuple, and $B_i$ comprises data corresponding to the ith tuple, while compressed firmware variables are stored in a 2-tuple format of $<M'_i, C(B_i)>$, wherein $M'_i$ comprises metadata corresponding to an ith tuple containing indicia indicating the ith tuple is compressed, $B_i$ comprises data corresponding to the ith tuple, and C represents a compression function.

4. A method comprising:
   storing a first converter and a second converter in a non-fault tolerant portion of a firmware storage device;
   storing a first deconverter and a second deconverter in a fault tolerant portion of the firmware storage device;
   determining if each of the first converter and the second converter are available;
   storing firmware variables in a combined converted form via first and second conversion operations performed by the first and second converters respectively if it is determined that both of the first and second converters are available;
   storing firmware variables in a first converted form via conversion operations performed by the first converter if the first converter is determined to be available and the second converter is not available;
   storing firmware variables in a second converted form via conversion operations performed by the second converter if it is determined that the second converter is available while the first converter is not available;
   otherwise storing the firmware variables in an unconverted form.

5. The method of claim 4, wherein the first converter comprises a compressor, and the first deconverter comprises a decompressor.

6. The method of claim 5, wherein the second converter comprises an encryptor and the second deconverter comprises a decryptor.

7. The method of claim 6, wherein the second converter adds error correction code (ECC) data to a variable, and the second deconverter utilizes the ECC data detect and correct bit errors in non-ECC data of the variable.

8. An article of manufacture, comprising:
   a machine-readable non-transitory storage medium on which instructions are stored, which when executed facilitate storage of firmware variables by performing operations including:
   receiving a request to store a first firmware variable;
   determining if a compressor stored in a non-fault tolerant portion of a firmware storage device is available for compressing the first firmware variable; and
   employing the compressor if it is available to compress the first firmware variable and storing the first firmware variable in a compressed form in a firmware storage device, the first firmware variable in the compressed form to be decompressed via a decompressor stored in a fault-tolerant portion of the firmware storage device, otherwise storing the first firmware variable in an uncompressed form in the firmware storage device if the compressor is not available.

9. The article of manufacture of claim 8, wherein the article comprises flash memory.

10. The article of manufacture of claim 9, wherein the flash memory includes the non-fault tolerant portion of memory in which the compressor is stored.

11. The article of manufacture of claim 10, wherein execution of the instructions performs the further operations of:
    receiving a request to store a second firmware variable;
    determining the compressor is no longer available; and
    storing the second firmware variable in the firmware storage device in an uncompressed form.

12. The article of manufacture of claim 9, wherein the flash memory includes the fault-tolerant portion of memory in which the decompressor is stored.

13. A computer system, comprising:
    a motherboard;
    a processor, coupled to the motherboard;
    volatile memory, coupled to the motherboard; and
    a boot firmware device, coupled to the motherboard and comprising flash memory having firmware components stored therein including a compressor, the firmware components comprising instructions that when executed by the processor effectuate storage of firmware variables by performing operations including:
    publishing an interface;
    receiving a request to store a firmware variable via the interface;
    determining if a compressor stored in a non-fault tolerant portion of a firmware storage device is available for compressing the firmware variable; and
    employing the compressor if it is available to compress the firmware variable and storing the firmware variable in a compressed form in a firmware storage device, the firmware variable in the compressed form to be decompressed via a decompressor stored in a fault-tolerant portion of the firmware storage device, otherwise storing the firmware variable in an uncompressed form in the firmware storage device if the compressor is not available.

* * * * *

UNITED STATES PATENT AND TRADEMARK OFFICE
CERTIFICATE OF CORRECTION

PATENT NO. : 7,934,209 B2
APPLICATION NO. : 10/561049
DATED : April 26, 2011
INVENTOR(S) : Zimmer et al.

Page 1 of 1

It is certified that error appears in the above-identified patent and that said Letters Patent is hereby corrected as shown below:

In column 15, at line 33 delete, "M," and insert -- $M_i$ --.

In column 15, at line 34 delete, "B," and insert -- $B_i$ --.

Signed and Sealed this
Fifth Day of July, 2011

David J. Kappos
*Director of the United States Patent and Trademark Office*